(12) United States Patent
Asai (10) Patent No.: US 7,097,466 B2
(45) Date of Patent: Aug. 29, 2006

(54) ELECTRONIC PART-MOUNTING SOCKET

(75) Inventor: Kiyoshi Asai, Tokyo (JP)

(73) Assignee: SMK Corporation, Tokyo (JP)

( * ) Notice: Subject to any disclaimer, the term of this patent is extended or adjusted under 35 U.S.C. 154(b) by 0 days.

(21) Appl. No.: 11/081,578

(22) Filed: Mar. 16, 2005

(65) Prior Publication Data

US 2005/0208790 A1 Sep. 22, 2005

(30) Foreign Application Priority Data

Mar. 18, 2004 (JP) ............................. 2004-078111

(51) Int. Cl.
*H01R 12/00* (2006.01)
(52) U.S. Cl. ....................... 439/76.1; 439/95
(58) Field of Classification Search ................. 439/71, 439/73, 76.1 I, 95 X, 331, 607
See application file for complete search history.

(56) References Cited

U.S. PATENT DOCUMENTS

| 4,655,519 | A | | 4/1987 | Evans et al. |
| 5,358,411 | A | | 10/1994 | Mroczkowski et al. |
| 5,498,166 | A | | 3/1996 | Rothenberger |
| 5,797,771 | A | * | 8/1998 | Garside ...................... 439/610 |
| 5,967,800 | A | | 10/1999 | Bishop |
| 5,980,268 | A | | 11/1999 | Mischenko et al. |
| 6,146,152 | A | | 11/2000 | McHugh et al. |
| 6,345,987 | B1 | | 2/2002 | Mori et al. |
| 6,468,092 | B1 | * | 10/2002 | Graff et al. ................. 439/76.1 |
| 6,705,878 | B1 | * | 3/2004 | Liang ........................ 439/76.1 |
| 6,857,906 | B1 | * | 2/2005 | Bricaud et al. ............. 439/630 |
| 6,932,623 | B1 | * | 8/2005 | Lai ............................ 439/76.1 |
| 6,939,172 | B1 | * | 9/2005 | Lu .............................. 439/607 |

FOREIGN PATENT DOCUMENTS

| EP | 0 664 580 A3 | 7/1995 |
| JP | 05-328570 | 12/1993 |
| WO | WO 00/54372 | 9/2000 |

* cited by examiner

*Primary Examiner*—Thanh-Tam Le
(74) *Attorney, Agent, or Firm*—Pearne & Gordon LLP (57) ABSTRACT

An electronic part-mounting socket includes a socket body having an electronic part-receiving portion for receiving an electronic part, and a plurality of contacts having a resilient contact piece portion projecting into the electronic part-receiving portion, and the electronic part is connected to a printed wiring board via the contacts. The socket body includes outer casing having a bottom plate and a contact holding member that is detachably received within the outer casing, and holds the contacts. Each of the contacts includes a board contact piece portion projecting from a lower surface of the contact holding member so as to be held in contact with the printed wiring board, and the printed wiring board is held between the bottom plate and the contact holding member.

15 Claims, 9 Drawing Sheets

ELECTRONIC PART-MOUNTING SOCKET

BACKGROUND OF THE INVENTION

This invention relates to a socket for mounting an electronic part, mainly such as a camera module and a semiconductor device, on a printed wiring board such as an FPC.

In recent years, portable electronic devices, such as a cellular phone, have been required to have a more compact (thinner) design, and to achieve such a compact design, a flexible printed wiring board (FPC) capable of incorporating an electronic circuit in a narrow space in a folded condition has been used within such an electronic device.

In the case of mounting an electronic part, such as a camera module, on a flexible printed wiring board, the electronic part, having a low degree of heat tolerance, can not be directly mounted thereon by soldering, and therefore a socket for electronic part-mounting purposes is beforehand attached to the FPC, and the electronic part is inserted into this socket to be mounted on the board.

In the above related technique, however, there was encountered a problem that the operation for connecting the electronic part-mounting socket to the flexible printed wiring board such as an FPC was cumbersome, and the efficiency of the operation was low.

And besides, in such a structure, it was difficult to shield the electronic part, and in such a case, a separate shielding member such as a shielding case, must be prepared, which invited problems that the process of the operation increased and that an installation space increased.

SUMMARY OF THE INVENTION

In view of the problems of the above related technique, it is an object of this invention to provide an electronic part-mounting socket which can be easily connected to a flexible printed wiring board such as an FPC, and also can suitably shield an electronic part.

In order to accomplish the above object, an electronic part-mounting socket of the present invention is characterized by having the following arrangement:

(1) An electronic part-mounting socket comprising:
   a socket body includes a box-shaped outer casing that has a bottom plate and a peripheral wall;
   an electronic part-receiving portion that is received within the outer casing and receives a part or whole of an electronic part that has a terminal portion;
   a contact holding member made of an insulative material, which is received within the outer casing, detachably and holds a printed wiring board that has a board terminal portion between the contact holding member and the bottom plate; and
   a plurality of contacts that are held by the contact holding member,
   wherein the plurality of contacts each include resilient contact piece portions projecting into the electronic part-receiving portion so as to be resiliently held in contact with the terminal portion of the electronic part and board contact piece portions projecting from a lower surface of the contact holding member so as to be resiliently held in contact with the board terminal portion of the printed wiring board, so that the printed wiring board is electrically connected to the electronic part via the plurality of contacts.

(2) An electronic part-mounting socket according to (1), wherein the outer casing has positioning projections that position the printed wiring board on the bottom plate.

(3) An electronic part-mounting socket according to (1) further comprising:
   a mounting lid that fits on an upper portion of the outer casing, so that the mounting lid presses the electronic part toward the contact holding member.

(4) An electronic part-mounting socket according to (1), wherein the outer casing includes a shielding member having electrical conductivity.

(5) An electronic part-mounting socket according to (3), wherein the outer casing and the mounting lid include shielding members having electrical conductivity.

(6) An electronic part-mounting socket according to (1), wherein the electronic part is one that produces high-frequency waves.

(7) An electronic part-mounting socket according to (5), wherein the electronic part is one that produces high-frequency waves.

(8) An electronic part-mounting socket comprising:
   an outer casing that has a bottom plate and a peripheral wall perpendicular to the bottom plate;
   an insulative contact holding member that is detachably received within the outer casing for holding the printed wiring board between the contact holding member and the bottom plate; and
   a contact that is held by the contact holding member and electrically connects the printing wiring board to an electronic part that is received by the contact holding member so that the contact holding member is interposed between the electronic part and the printed wiring board.

(9) An electronic part-mounting socket according to (8), wherein the outer casing has positioning projections that position the printed wiring board on the bottom plate.

(10) An electronic part-mounting socket according to (8) further comprising:
   a mounting lid that is fitted on a portion of the peripheral wall opposed to the bottom plate and is operable to press the electronic part toward the contact holding member to hold the electronic part in cooperation with the contact holding member.

(11) An electronic part-mounting socket according to (8), wherein the outer casing includes a shielding member having electrical conductivity.

(12) An electronic part-mounting socket according to (10), wherein the outer casing and the mounting lid include shielding members having electrical conductivity.

(13) An electronic part-mounting socket according to (8), wherein the electronic part is one that produces high-frequency waves.

(14) An electronic part-mounting socket according to (12), wherein the electronic part is one that produces high-frequency waves.

(15) An electronic part-mounting socket according to (8), wherein a plurality of the contacts that are held by the contact holding member.

In the electronic part-mounting structure of the invention, the socket body includes the box-shaped outer casing having the bottom plate and the peripheral wall, and the flat plate-like insulative contact holding member which is detachably received within the outer casing, and holds the contacts, and the contact includes the board contact piece portion projecting from the lower surface of the contact holding member so as to be resiliently contacted with the board terminal portion formed on the printed wiring board, and the printed wiring board is held between the bottom plate of the outer casing and the contact holding member. With this construction, the electronic part, such as a camera module and a semiconductor device, can be easily connected to the printed wiring board such as an FPC, and besides this construction is eco-friendly since soldering is not used.

The positioning projections that position the printed wiring board are formed on the bottom plate of the outer casing, and therefore the printed wiring board can be held accurately in the proper position, and the connection of a higher reliability can be obtained.

The mounting lid is fitted on the upper portion of the outer casing, so that the mounting lid presses the electronic part toward the contact holding member. With this construction, it is not necessary to provide any retaining metal fittings for retaining the electronic part relative to the socket body, and therefore the space can be saved, and besides the compact design can be achieved.

The outer casing and the mounting lid include the metallic shielding members, respectively, and therefore the mounting the electronic part on the printed wiring board such as an FPC and the shielding of the electronic part can be operated at the same time, so that the space-saving efficiency and the operation efficiency can be enhanced.

DETAIL DESCRIPTION OF THE DRAWING

An electronic part-mounting socket of the present invention will now be described with reference to FIGS. 1 to 13C.

Figure 1:
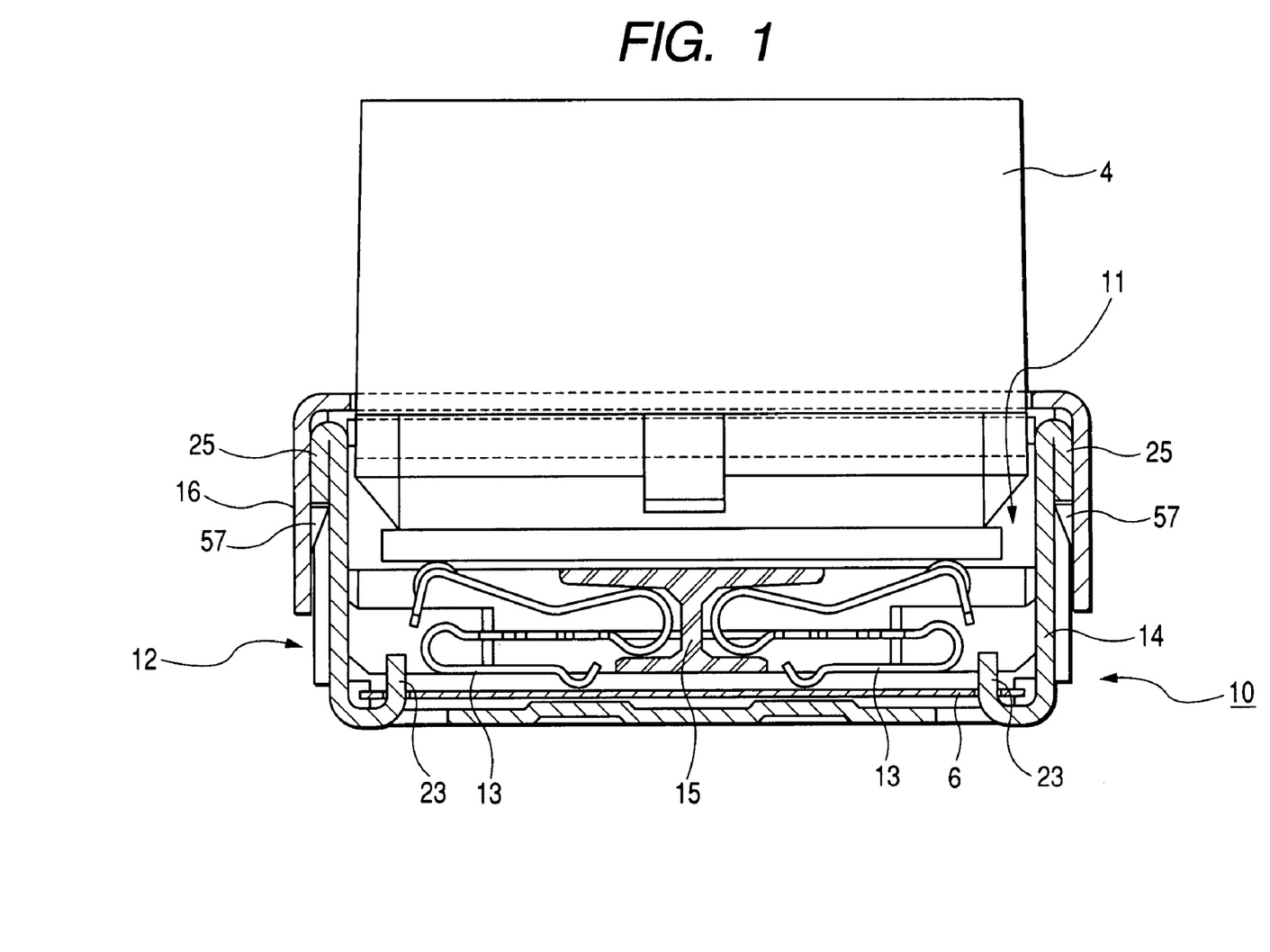
FIG. 1 is a cross-sectional view showing a condition in which an electronic part-mounting socket of the present invention is used.

FIG. 1 shows a condition in which a camera module that is an electronic part is mounted on an FPC by the electric part-mounting socket. In the drawings, reference numeral 10 denotes the electronic part-mounting socket, reference numeral 4 the electronic part (camera module), and reference numeral 6 a printed wiring board such as an FPC.

The electronic part-mounting socket 10 includes a socket body 12 having an electronic part-receiving portion 11 for receiving a part or whole of the electronic part 4, and a plurality of contacts 13 having their respective resilient contact piece portions projecting into the electronic part-receiving portion 11. The electronic part 4, received in the electronic part-receiving portion 11, is connected to the printed wiring board 6, such as an FPC, via the contacts 13.

Figure 2:
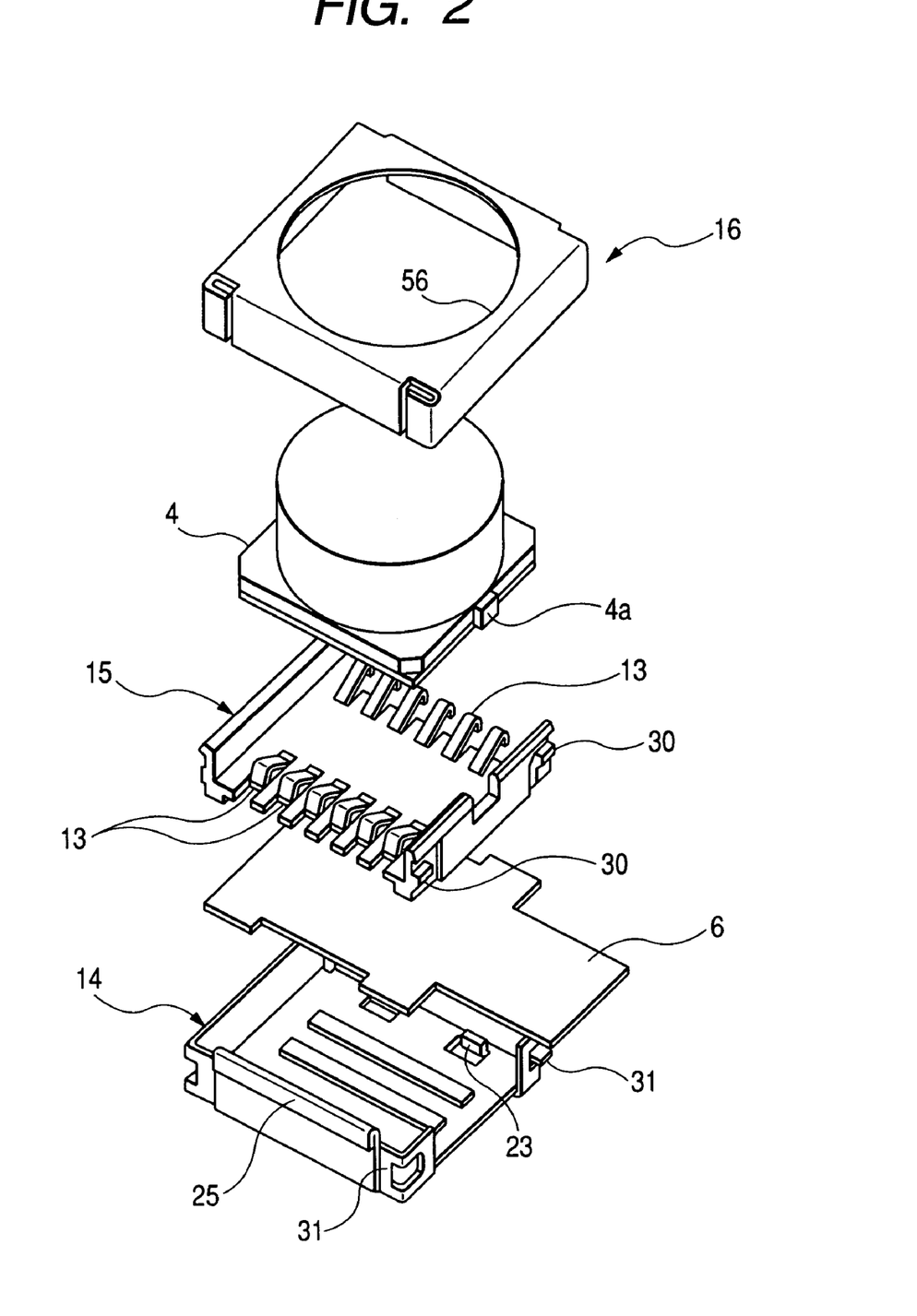
FIG. 2 is an exploded perspective view showing the electronic part-mounting socket.

The socket body 12 includes a box-shaped outer casing 14, and a contact holding member 15 detachably received within the outer casing 14. A mounting lid 16 is fitted on an upper portion of the outer casing 14 to close an upper side thereof.

Figure 7:
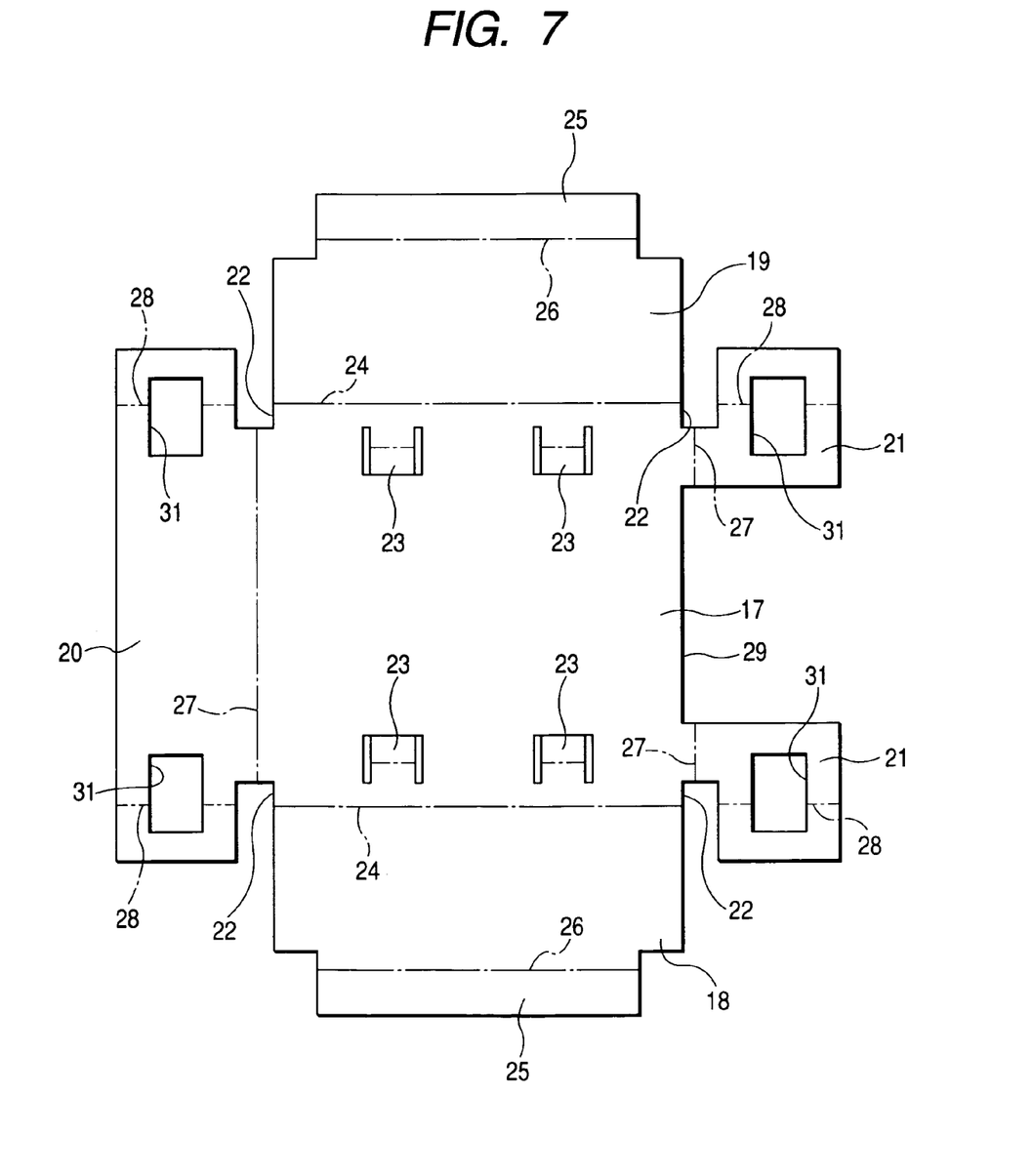
FIG. 7 is a development view of the outer casing.

As shown in FIGS. 3 to 6, the outer casing 14 is formed into a box-like shape with an open top, and is defined by a flat plate-like bottom plate 17 and a peripheral wall composed of peripheral wall plates 18, 19, 20 and 21 extending upright from peripheral edges of the bottom plate 17. This outer casing is formed by stamping a piece from a metallic sheet material composed of a tinned copper alloy as shown in FIG. 7 which is a development view and then by bending it.

Figure 3:
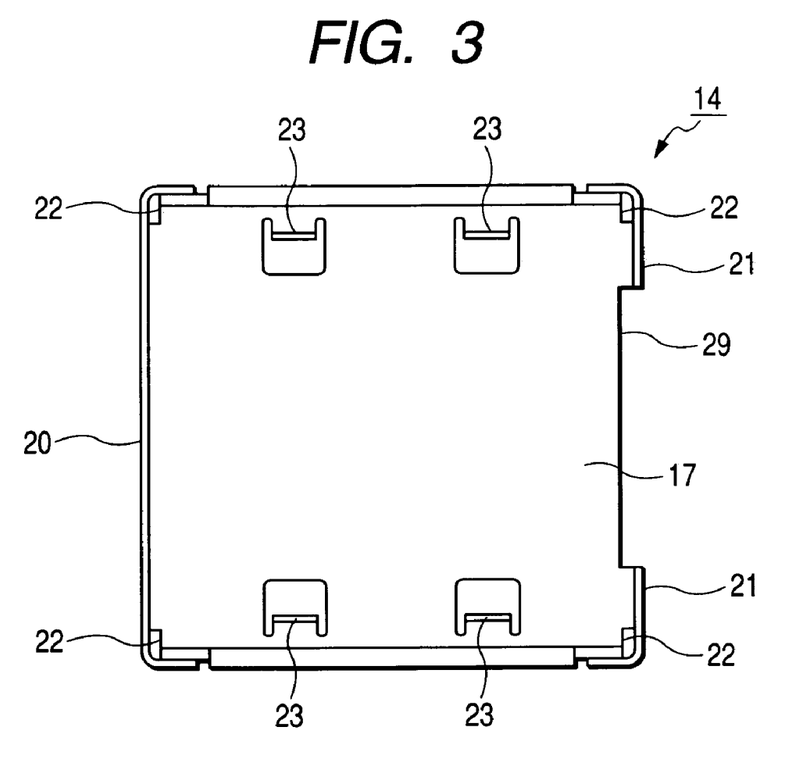
FIG. 3 is a plan view of an outer casing in FIG. 1.
Figure 4:
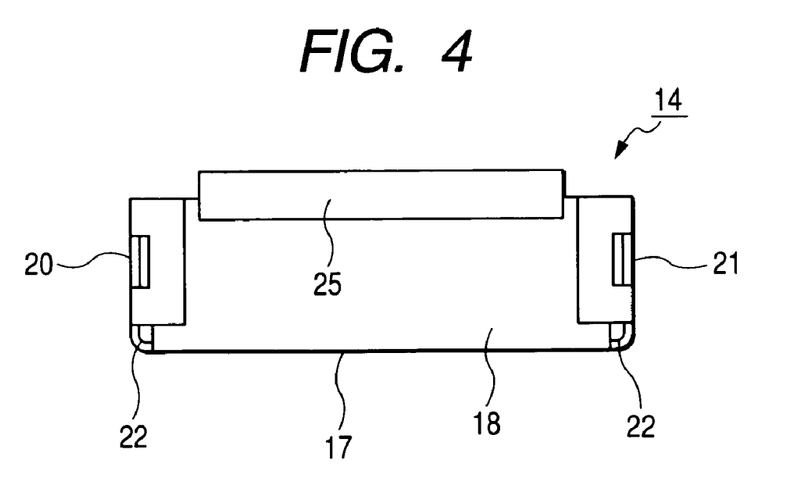
FIG. 4 is a front-elevational view of the outer casing.
Figure 5:
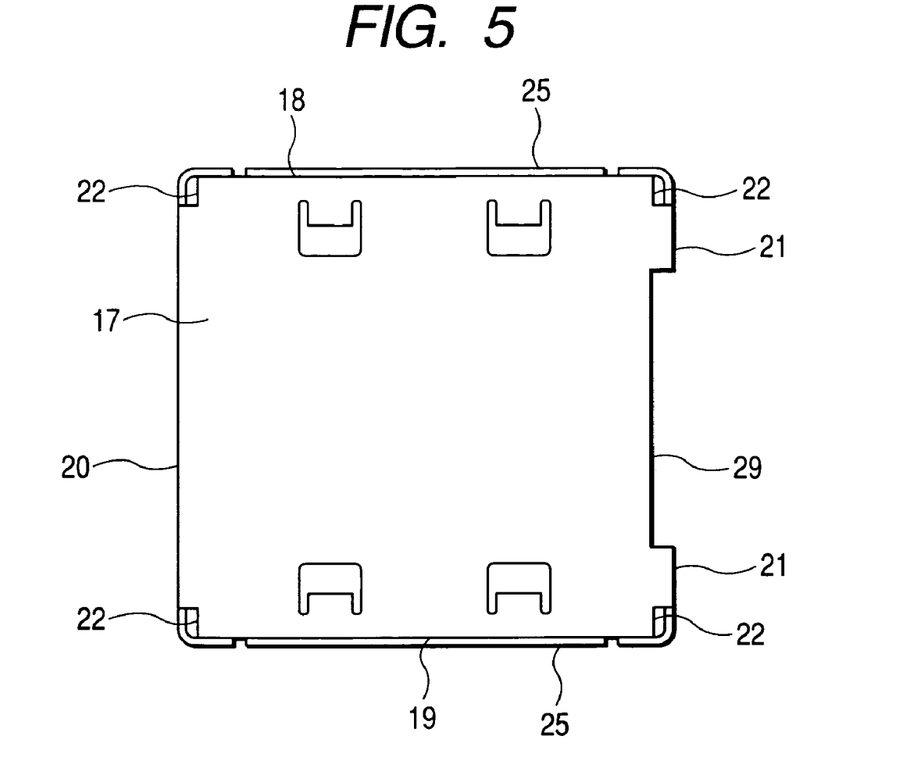
FIG. 5 is a bottom view of the outer casing.
Figure 6:
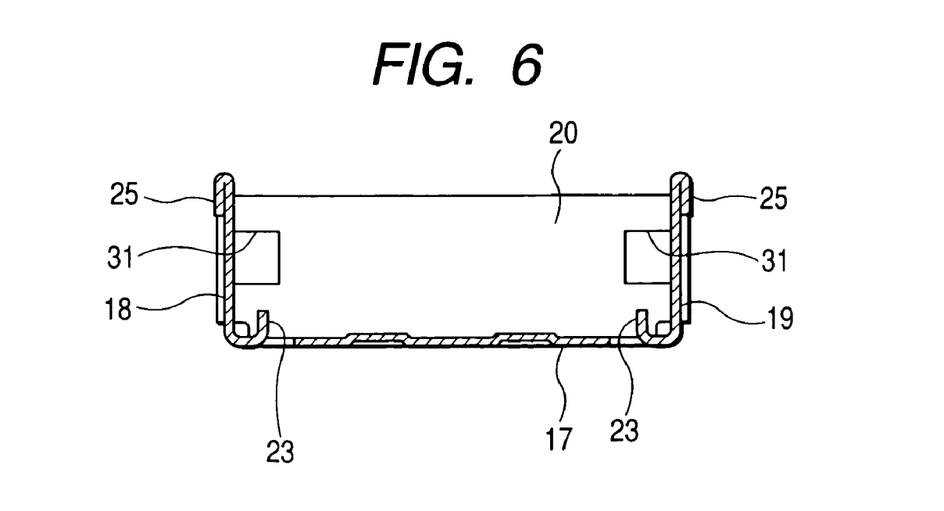
FIG. 6 is a cross-sectional view of the outer casing.

The bottom plate 17 is formed into a generally square shape, and notches 22 for bending purposes are formed in four corner portions thereof, respectively, so that the peripheral wall plates 18, 19, 20 and 21 can be easily bent.

Further, U-shaped slits are formed in predetermined portions of the bottom plate 17, respectively, and these portions are bent upwardly at their respective proximal end portions to form positioning projections 23 respectively at predetermined positions, that is, in conformity with the shape of the printed wiring board 6.

The peripheral wall plates 18 and 19 are formed in continuous relation to the bottom plate 17 via respective bending lines 24, and retaining bend-back piece portions 25 are formed integrally respectively with upper edges of these plates 18 and 19, which is remote from the respective bending lines 24, via respective bending lines 26.

The retaining bend-back piece portions 25 are bent outwardly to be disposed in contiguous relation respectively to the outer surfaces of the peripheral wall plates 18 and 19, and retaining projections 57, formed on an inner surface of the mounting lid 16, can be fitted to the lower edges of these piece portions 25 which are remote from the respective bending lines 26, therefore the mounting lid 16 is fitted to the outer casing 14.

On the other hand, the peripheral wall plates 20 and 21 are formed integrally with the bottom plate 17 via respective bending lines 27, and opposite ends of each of these plates 20 and 21 are extended, and the opposite end portions of each of these plates are bent at bending lines 28 and 28, respectively, and are disposed in contiguous relation to end portions of the peripheral wall plates 18 and 19, respectively.

Fitting holes 31 are formed through the opposite end portions of the peripheral wall plates 20 and 21, respectively, and fitting projections 30 formed on an outer surface of the contact holding member 15, can be fitted in these fitting holes 31, respectively.

An insertion notch 29 for the insertion of the printed wiring board 6 is formed in an intermediate portion of the peripheral wall plate 21.

As shown in FIGS. 8 to 11, the contact holding member 15 is formed into a flat plate-like shape, that is, a flattened rectangular parallelepiped shape, made of a synthetic resin, and electronic part-holding walls 32 and 33 are formed integrally on an upper surface thereof.

Figure 8:
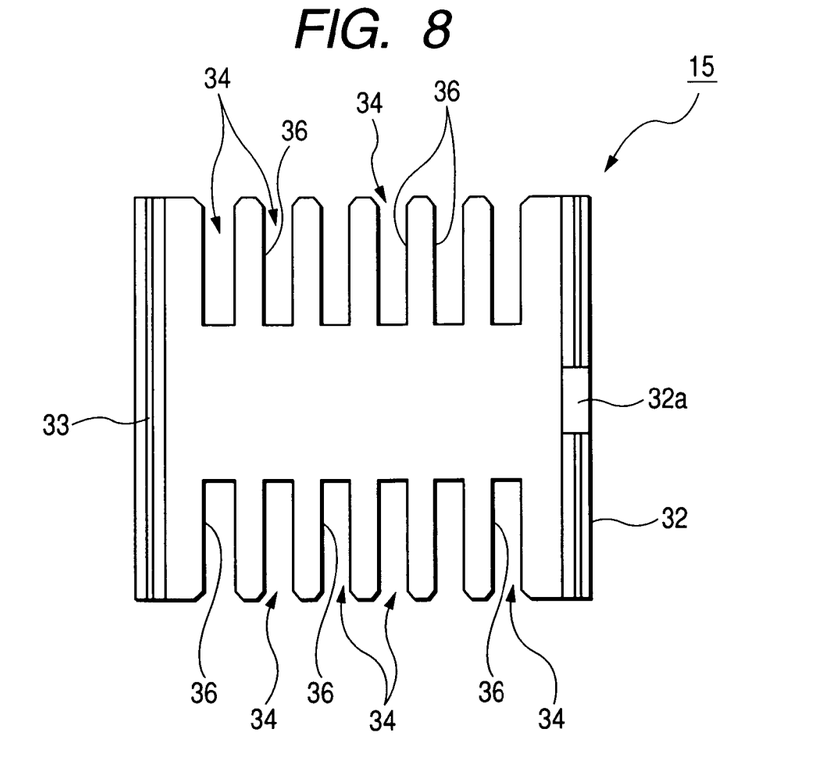
FIG. 8 is a plan view showing a contact holding member in FIG. 1.
Figure 9:
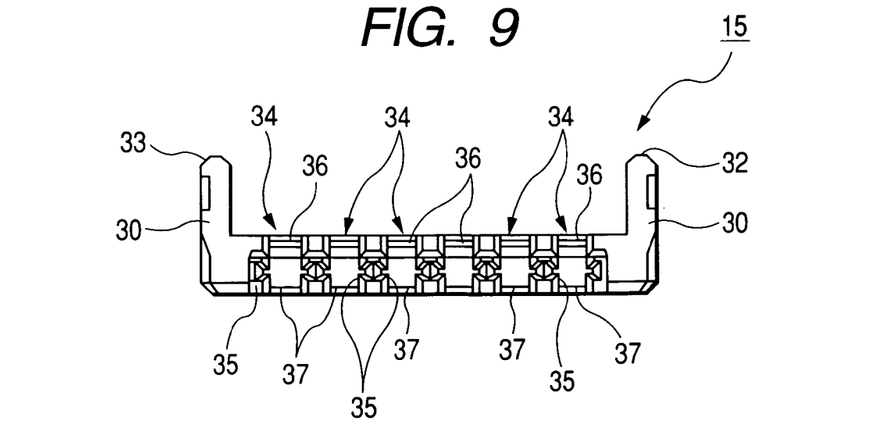
FIG. 9 is a front-elevational view of the contact holding member.

The electronic part-holding wall 32 has a positioning recess 32a into which positioning projections 4a on the electronic part 4 can be fitted, and the electronic part 4 can be held between the two walls 32 and 33. Therefore, the contact holding member receives the electronic part.

Contact insertion holes 34 are formed in each of opposite side portions of the contact holding member 15, and are arranged at predetermined intervals, and the contacts 13 can be inserted into the contact insertion holes 34 in a horizontal direction, respectively.

Figure 11:
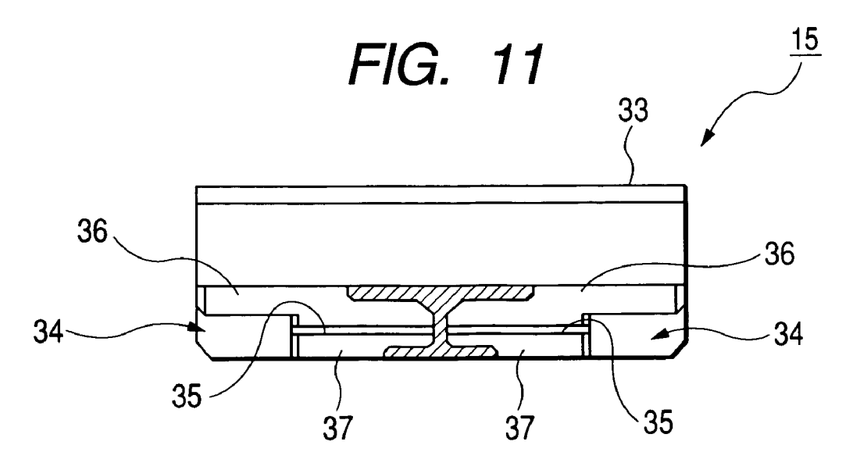
FIG. 11 is a cross-sectional view of the contact holding member.

Contact mounting grooves 35 are formed respectively at opposite side portions of each contact insertion hole 34 at a lower end of an inner portion thereof, and the inserted contact 13 can be fitted into the contact mounting grooves 35, therefore the contact 13 is fixed to the contact holding member 15.

Figure 10:
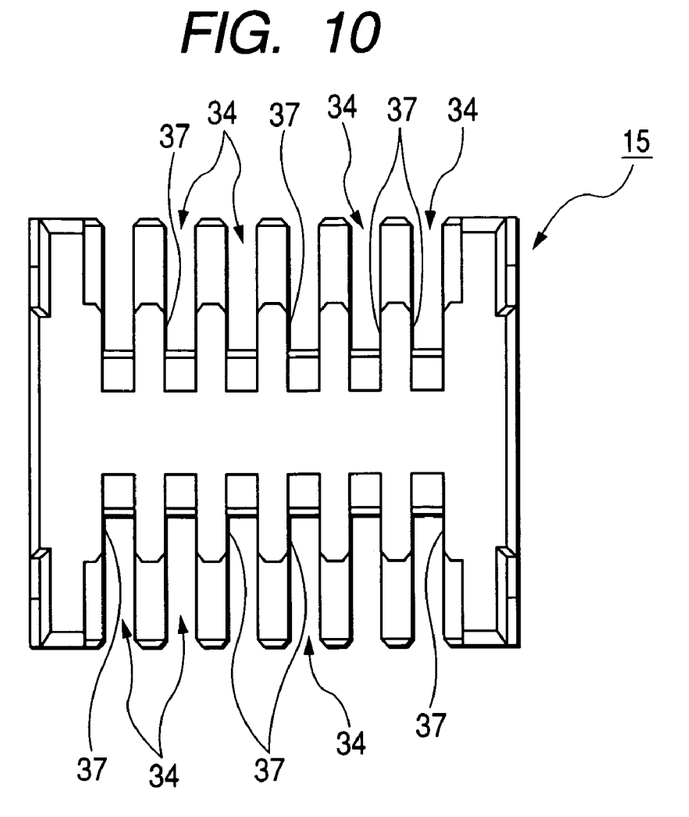
FIG. 10 is a bottom view of the contact holding member.

A resilient contact piece portion-projecting recess 36 which is open to the upper surface of the contact holding member 15 and a board contact piece portion-projecting recess 37 which is open to the lower surface of the contact holding member 15 communicate with the contact insertion hole 34, respectively. The resilient contact piece portion projects into the electronic part-receiving portion 11 through the resilient contact piece portion-projecting recess 36, while a board contact piece portion projects from the lower surface of the contact holding member 15 through the board contact piece portion-projection recess 37.

As shown in FIGS. 12A to 12D, the contact 13 includes a flat plate-like mounting portion 40, the resilient contact piece portion 41 bent at one end of the mounting portion 40 to extend continuously therefrom, and the board contact piece portion 42 bent at the other end of the mounting portion 40 to extend continuously therefrom. The contact is formed by stamping a piece of a predetermined shape from an electrically-conductive metallic sheet material and then by bending it.

The mounting portion 40 is larger in width than the contact insertion hole 34, and retaining projections 43 are formed integrally on opposite side edges of this mounting portion. The opposite side portions of the mounting portion are fitted respectively into the contact mounting grooves 35, with the retaining projections 43 cut thereinto, thereby fixing the contact to the contact holding member 15.

The resilient contact piece portion 41 is bent back at the end of the mounting portion 40 into a generally arc-shape, and is further bent in such a manner that its distal end portion extends in a slanting direction, and further the distal end portion is bent into an inverted V-shape to form a contact portion 44 for contact with a terminal portion of the electronic part 4.

Similarly, the board contact piece portion 42 is bent back at the other end of the mounting portion 40 into a generally arc-shape in a direction opposite to the direction of bending of the resilient contact piece portion 41, and is further bent in such a manner that its distal end portion extends in a slanting direction, and further the distal end portion is bent into a generally arc-shape to form a contact portion 45 for contact with a terminal pattern on the printed wiring board 6.

Figure 12A:
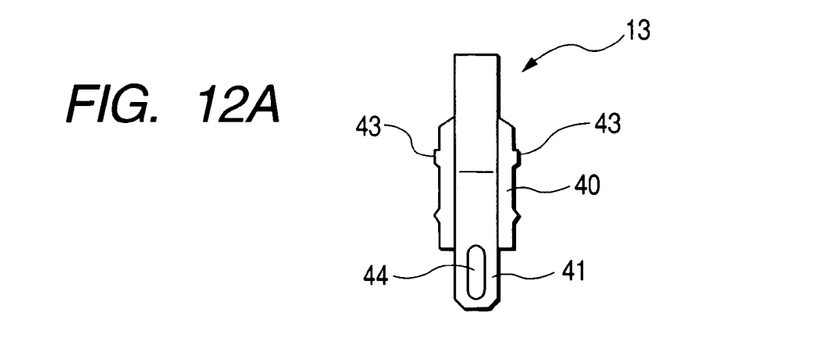
FIG. 12A is a plan view of a contact.
Figure 12B:
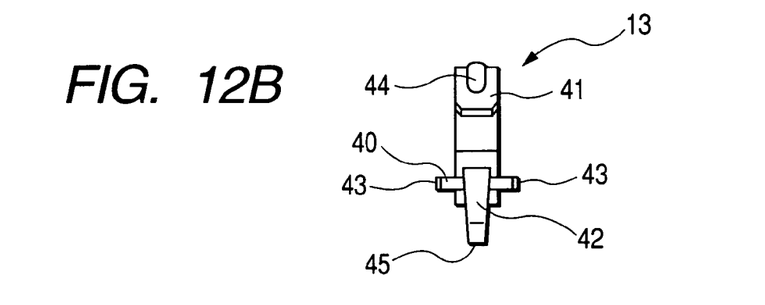
FIG. 12B is a front-elevational view thereof.
Figure 12C:
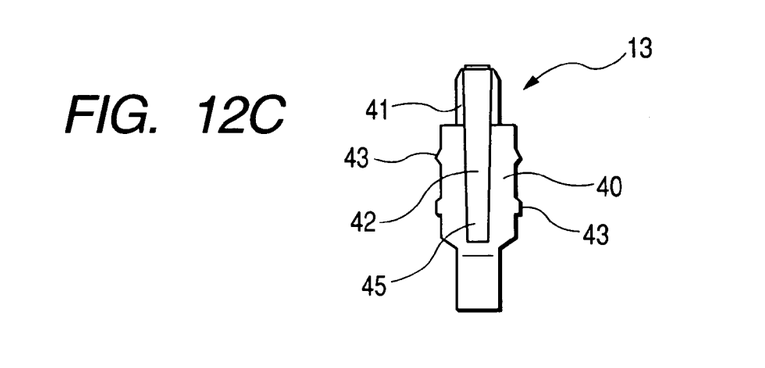
FIG. 12C is a bottom view thereof.
Figure 12D:
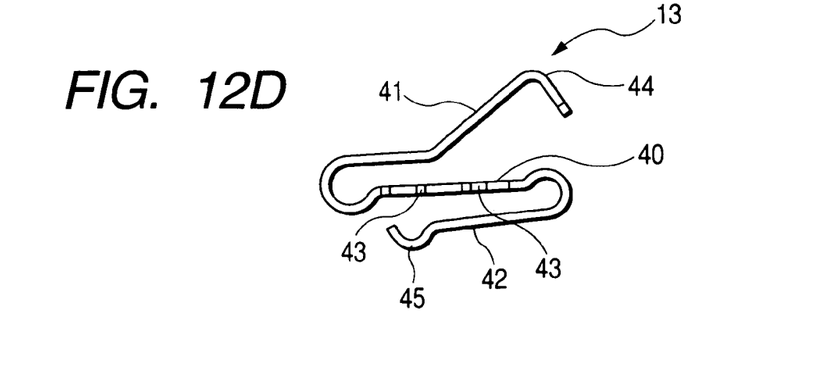
FIG. 12D is a side-elevational view.

The contact 13 is inserted into the contact insertion hole 34 from the side of the contact holding member 15, and the opposite side portions of the mounting portion 40 are fitted respectively into the contact mounting grooves 35, thereby fixing the contact to the contact holding member 15. The resilient contact piece portion 41 projects into the electronic part-receiving portion 11 through the resilient contact piece portion-projecting recess 36, while the board contact piece portion 42 projects from the lower surface of the contact holding portion 15 through the board contact piece portion-projecting recess 37.

Figure 13A:
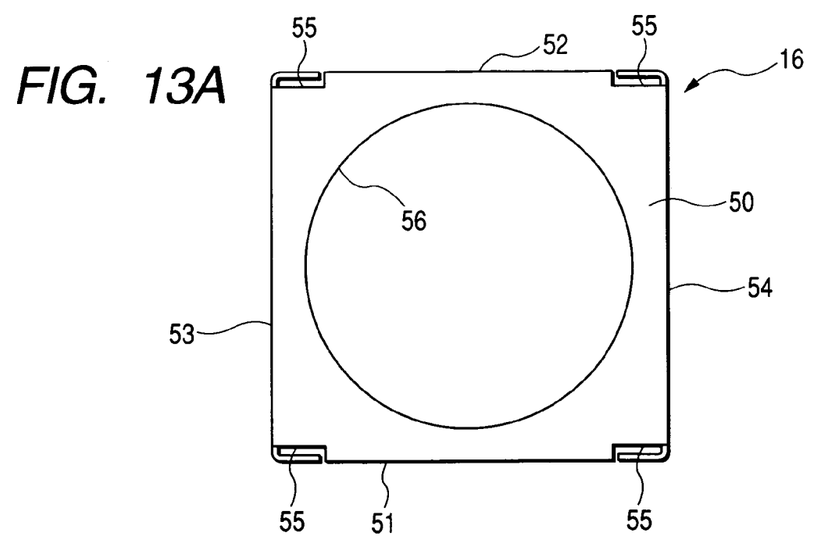
FIG. 13A is a plan view of a mounting lid.
Figure 13B:
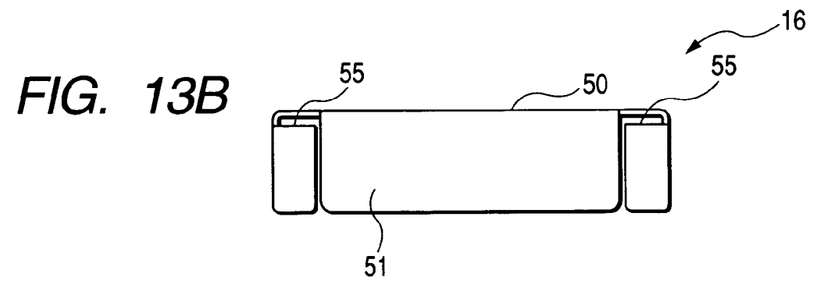
FIG. 13B is a front-elevational view thereof.
Figure 13C:
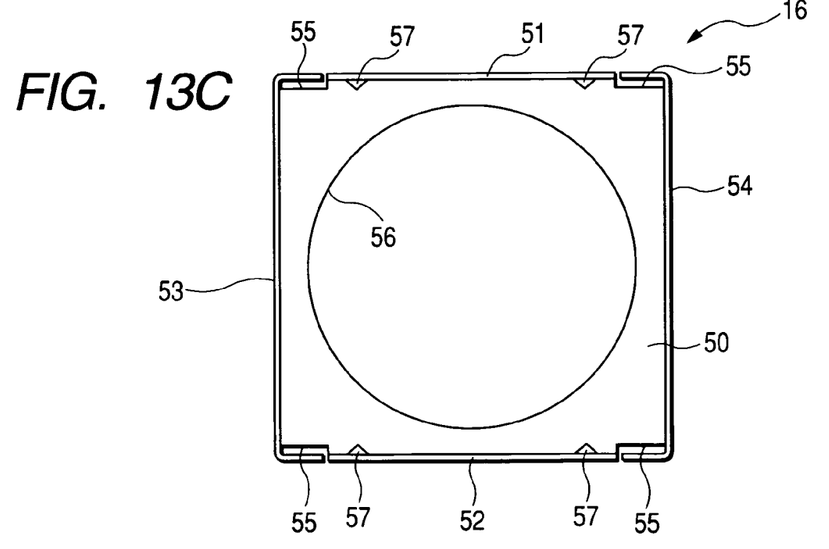
FIG. 13C is bottom view thereof.

As shown in Figs 13A to 13C, the mounting lid 16 includes a flat plate-like top plate 50, and side plates 51, 52, 53 and 54 bent respectively at four sides of the top plate 50. This mounting lid is formed into a box-like shape with an open bottom by stamping a piece of predetermined shape from a sheet material composed of a tinned copper alloy or the like, and then by bending it.

The top plate 50 is formed into a flat plate-like shape having bending-purpose notches 55 formed respectively at four corner portions thereof, and an insertion hole 56 into which a part of the camera module 4 projects is formed through a central portion thereof.

The side plates 51, 52, 53 and 54 continuously extend from the four sides of the top plate via respective bending lines, respectively.

Each of the side plates 51 and 52 is formed into a flat plate-like shape, and the retaining projections 57 for retaining the lower edge of the corresponding retaining bend-back piece portion 25 are formed on the side plate 51, 52.

In the electronic part-mounting socket 10 of the above construction, the printed wiring board 6 such as an FPC, the contact holding member 15 and the electronic part 4 such as a camera module are sequentially inserted into the outer casing 14. When the mounting lid 16 is fitted on the upper portion of the outer casing 14, the mounting lid 16 presses the electronic part 4 toward the contact holding member to hold the electronic part in cooperation with the contact holding member, which is interposed between the electronic part 4 and the printed wiring board 6, and the board contact piece portions are held in contact with the respective terminal pattern portions of the printed wiring board 6 with a suitable contact pressure, so that the terminal portions of the electronic part 4 are held in contact with the respective resilient contact piece portions with a suitable contact pressure, and the printed wiring board 6 is held between the bottom plate 17 of the outer casing and the contact holding member 15.

As a result, the printed wiring board 6 is fixed to the electronic part-mounting socket 10, and also the electronic part 4 is electrically connected to the printed wiring board 6 via the electronic part-mounting socket 10.

And besides, the outer casing 14 and the mounting lid 16 include the electrically-conductive shielding members, respectively, and therefore the shielding of the electronic part 4 such as a camera module is effected simultaneously with the mounting operation.

In the above embodiment, although the outer casing and the mounting lid include the electrically-conductive shielding members, respectively, they can be formed of any other suitable material such as a synthetic resin.

In the above embodiment, the electronic part is fixed to the socket, using the mounting lid. However, instead of using the mounting lid, retaining means such as metal fittings can be provided at the contact holding member.

In the above embodiment, although the flexible printed wiring board (FPC) is used as the printed wiring board, any other suitable ordinary printed wiring board can be used.

In the above embodiment, although the camera module is used as the electronic part 4, not only a high-frequency electronic part such as a camera module and an IC unit but also a semiconductor device and various electronic parts can be used.

What is claim is:
1. an electronic part-mounting socket comprising:
a socket body includes a box-shaped outer casing that has a bottom plate and a peripheral wall;
an electronic part-receiving portion that is received within the outer casing and on which a part or whole of an electronic part that has a terminal portion is mounted in a mounting direction;

a contact holding member made of an insulative material, which is received within the outer casing, detachably and holds a printed wiring board that has a board terminal portion between the contact holding member and the bottom plate;

a plurality of contacts that are held by the contact holding member; and a mounting lid that fits on an upper portion of the outer casing in the mounting direction, wherein the plurality of contacts each include resilient contact piece portions projecting into the electronic part-receiving portion so as to be resiliently held in contact with the terminal portion of the electronic part and board contact piece portions projecting from a lower surface of the contact holding member so as to be resiliently held in contact with the board terminal portion of the printed wiring board, so that the printed wiring board is electrically connected to the electronic part via the plurality of contacts.

2. An electronic part-mounting socket according to claim 1, wherein the outer casing has positioning projections that fit into concave parts of the printed wiring board and position the printed wiring board on the bottom plate.

3. An electronic part-mounting socket according to claim 1, wherein the mounting lid presses the electronic part toward the contact holding member.

4. An electronic part-mounting socket according to claim 1, wherein the outer casing includes a shielding member having electrical conductivity.

5. An electronic part-mounting socket according to claim 3, wherein the outer casing and the mounting lid include shielding members having electrical conductivity.

6. An electronic part-mounting socket according to claim 1, wherein the electronic part is one that produces high-frequency waves.

7. An electronic part-mounting socket according to claim 5, wherein the electronic part is one that produces high-frequency waves.

8. An electronic part-mounting socket comprising:

an outer casing that has a bottom plate and a peripheral wall perpendicular to the bottom plate;

an insulative contact holding member that is detachably received within the outer casing for holding a printed wiring board between the contact holding member and the bottom plate;

a contact that is held by the contact holding member and electrically connects the printing wiring board to an electronic part that is mounted on the contact holding member in a mounting direction so that the contact holding member is interposed between the electronic part and the printed wiring board; and a mounting lid that is fitted on a portion of the peripheral wall opposed to the bottom plate in the mounting direction, wherein the contact resiliently contacts the printing wiring board and the electronic part, respectively.

9. An electronic part-mounting socket according to claim 8, wherein the outer casing has positioning projections that fit into concave parts of the printed wiring board and position the printed wiring board on the bottom plate.

10. An electronic part-mounting socket according to claim 8, wherein the mounting lid is operable to press the electronic part toward the contact holding member to hold the electronic part in cooperation with the contact holding member.

11. An electronic part-mounting socket according to claim 8, wherein the outer casing includes a shielding member having electrical conductivity.

12. An electronic part-mounting socket according to claim 10, wherein the outer casing and the mounting lid include shielding members having electrical conductivity.

13. An electronic part-mounting socket according to claim 8, wherein the electronic part is one that produces high-frequency waves.

14. An electronic part-mounting socket according to claim 12, wherein the electronic part is one that produces high-frequency waves.

15. An electronic part-mounting socket according to claim 8, wherein a plurality of the contacts that are held by the contact holding member.

* * * * *